US006525466B1

(12) United States Patent
Jabbour et al.

(10) Patent No.: US 6,525,466 B1
(45) Date of Patent: Feb. 25, 2003

(54) CATHODE INCLUDING A MIXTURE OF A METAL AND AN INSULATOR FOR ORGANIC DEVICES AND METHOD OF MAKING THE SAME

(75) Inventors: Ghassan E. Jabbour, Tucson, AZ (US); Nasser N. Peyghambarian, Tucson, AZ (US); Bernard Kippelen, Tucson, AZ (US)

(73) Assignee: Arizona Board of Regents on behalf of the University of Arizona, Tucson, AZ (US)

( * ) Notice: Subject to any disclaimer, the term of this patent is extended or adjusted under 35 U.S.C. 154(b) by 0 days.

(21) Appl. No.: 09/544,495

(22) Filed: Apr. 7, 2000

Related U.S. Application Data

(60) Provisional application No. 60/128,572, filed on Apr. 9, 1999.

(51) Int. Cl.⁷ .............................................. H05B 33/00
(52) U.S. Cl. ....................... 313/504; 313/506
(58) Field of Search .............................. 313/504, 506, 313/503, 509; 428/690; 257/10, 40, 98

(56) References Cited

U.S. PATENT DOCUMENTS

| | | | |
|---|---|---|---|
| 5,315,129 A | | 5/1994 | Forrest et al. |
| 5,399,502 A | | 3/1995 | Friend et al. |
| 5,424,560 A | | 6/1995 | Norman et al. |
| 5,583,349 A | | 12/1996 | Norman et al. |
| 5,583,350 A | | 12/1996 | Norman et al. |
| 5,587,589 A | | 12/1996 | So et al. |
| 5,881,089 A | | 3/1999 | Berggren et al. |
| 5,970,318 A | | 10/1999 | Choi et al. |
| 6,028,327 A | * | 2/2000 | Mizoguchi et al. ......... 313/506 |

OTHER PUBLICATIONS

Aluminum Composite Cathodes: A New Method for the Fabrication of Efficient and Bright Organic Light–emitting Devices: G.E. Jabbour, et al.: *Optics and Photonics News*, Apr. 1999; pp. 25–27.

Bright blue organic light–emitting diode with improved color purity using a LiF/Al cathode; S.E. Shaheen, et al.; *J. of Applied Physics*, Aug. 1998; pp. 2324–2327.

Oxadiazole Metal Complex for Organic Light–Emitting Diodes; J.F. Wang, et al.: *Advanced Materials*, 1999; pp. 1266–1269. No month.

Sharp Red Organic Light–Emitting Devices with Enhanced Efficiency; G.E. Jabbour, et al.: *Jpn. J. Appl. Phys.* vol. 38 (1999); pp. 1553–1555. Dec. 1999.

Aluminum based catherode structure for enhanced for enhanced electron injection in electroluminescent organic devices; G.E. Jabbour, et al.: *Applied Physics Letters*, Aug. 1998; 1185–1187.

Conjugated polymer light–emitting diodes on sillicon substrates; D.R. Baigent, R.N. Marks, N.C. Greenham, R.H. Friend, S.C. Moratti and A.B. Holmes; Applied Physics Letters; vol. 65, No. 21; Nov. 21, 1994; pp. 2636–2638.

(List continued on next page.)

*Primary Examiner*—Vip Patel
*Assistant Examiner*—Joseph Williams
(74) *Attorney, Agent, or Firm*—Oblon, Spivak, McClelland, Maier & Neustadt, P.C.

(57) ABSTRACT

An organic device including an organic layer of organic material; and a cathode in contact with the organic layer and including a mixture of a metal and an insulator. The mixture can be an alloy or a composite of the metal and insulator, and can be for example a mixture of Al:LiF or Al:CsF. The device can be incorporated in an organic light-emitting device, an organic transistor, an organic solid state laser, or any device requiring carrier injection into an organic material.

45 Claims, 9 Drawing Sheets

OTHER PUBLICATIONS

Organic electroluminescent diodes; C.W. Tang and S.A. VanSlyke; Applied Physics Letters; vol. 51; No. 12; Sep. 21, 1987; pp. 913–915.

Bright high efficiency blue organic light–emitting diodes with $Al_2O_3$/Al cathodes; H. Tang, F. Li and J. Shinar; Applied Physics Letters; vol. 71; No. 18; Nov. 3, 1997; pp. 2560–2562.

Enhanced electron injection in organic electroluminescence devices using an Al/LiF electrode; L.S. Hung, C.W. Tang and M.G. Mason; Applied Physics Letters; vol. 70, No. 2; Jan. 13, 1997; pp. 152–154.

Photoemission study of aluminum/tris–(8–hydroxyquinoline) aluminum and aluminum/LiF/tris–(8–hydroxyquinoline) aluminum interfaces; Q.T. Le, L. Yan, Y. Gao, M.G. Mason, D.J. Giesen, and C.W. Tang; Journal of Applied Physics; vol. 87; No. 1; Jan. 1, 2000; pp. 375–379.

Lithium–aluminum contacts for organic light–emitting devices; E.I. Haskal, A. Curioni, P.F. Seidler, and W. Andreoni; Applied Physics Letters; vol. 71; No. 9; Sep. 1, 1997; pp. 1151–1153.

Work functions of binary compounds; S. Yamamoto, K. Susa and U. Kawabe; The Journal of Chemical Physics; vol. 60; No. 10; May 15, 1974; pp. 4076–4080.

Organic El Cells Using Alkaline Metal Compounds as Electron Injection Materials; T. Wakimoto, Y. Fukuda, K. Nagayama, A. Yokoi, H. Nakada and M. Tsuchida; IEEE Transactions of Electron Devices; vol. 44; No. 1; Aug., 1997; pp. 1245–1248.

\* cited by examiner

CATHODE INCLUDING A MIXTURE OF A METAL AND AN INSULATOR FOR ORGANIC DEVICES AND METHOD OF MAKING THE SAME

CROSS-REFERENCE TO RELATED APPLICATIONS

This document claims priority from Provisional Application Ser. No. 60/128,572 filed Apr. 9, 1999, the entire content of which is hereby incorporated by reference.

BACKGROUND OF THE INVENTION

1. Field of the Invention

The present invention relates to a cathode that may be incorporated into organic light-emitting devices, display panels, organic transistors, and organic solid state lasers.

2. Description of the Related Art

Organic light-emitting devices (OLEDs) have recently become a prime focus of numerous researchers because of their relative simplicity of fabrication, large viewing angle, ultra-thin structure, mechanical flexibility, light weight, and faster response time. In particular, OLEDs are being investigated as candidates for commercial display applications, such as ultra-thin flat panel displays (FPDs), roll-up displays, and head-mounted displays, such as virtual reality and cockpit displays. The utility of OLEDs is expected to be especially important in FPDs incorporated in high definition televisions, personal computers, and portable computers.

A cross-section of a conventional bilayer (two organic layers) OLED 10 structure is shown in FIG. 1. The operation of the OLED 10 can be described as follows: upon the application of a voltage, holes (represented by open ovals) are injected from the anode 20 into the highest occupied molecular orbital (HOMO) of the molecules of a first organic layer 30, called the hole transport layer (HTL) 30, and electrons (represented by closed ovals) are injected from the cathode 40 into the lowest unoccupied molecular orbital (LUMO) of the molecules of a second organic layer 50, called the electron transport layer (ETL) 50. The charges drift under the influence of the external field and recombine in the emitting layer 60, which can be the HTL 30 or the ETL 50, thereby generating excited molecules. Some of the excited molecules decay radiatively, thus releasing light (represented by arrows). The materials forming HTL 30 and the ETL 50 are thus electroluminescent organic (ELO) materials. An example of a material for HTL 30 is TPD, the structure of which is shown in FIG. 2(A), and an example of a material for ETL 50 is 8-tris-hydroxyquinoline ($Alq_3$), the structure of which is shown in FIG. 2(B).

One of the electrodes, for example the anode 20, can be transparent to allow the transmission of light to the outside environment so that a viewer can see it. Due to its relatively high transparency to visible light and its relatively good electrical conductivity, indium tin oxide (ITO) can be used as the material for the anode 20. A substrate 70, for example made of glass, can support the anode 20. The material of the cathode 40 is often a metal such as Al or Mg, although other variances have been used as discussed below.

In general, organic materials have a higher hole mobility than electron mobility. This relatively high hole mobility, as well as the presence of a high barrier ($\Phi_e$) for electron injection at the cathode-organic layer interface, lead to an imbalance between the hole charge density and the electron charge density near the interface of the two organic layers. This behavior has a negative effect on the device external quantum efficiency, which is defined as the ratio of the number of photons collected (for example measured with a calibrated silicon photodetector) in the forward direction to the number of charges injected in the device.

One way to enhance the external quantum efficiency is to increase the number of injected electrons. This can be achieved by decreasing the barrier height between the work function of the metal cathode and the LUMO of the ETL. To that end, OLED cathodes based on metals with a relatively low work function such as lithium, calcium, or magnesium, are used and show higher external quantum efficiency than similar devices with cathodes such as aluminum (Al), copper, or silver. However, the major drawback of using low work function metals is their readily reactive nature, especially in air atmosphere, which results in unreliable OLEDs.

More environmentally stable cathodes such as Al are sometimes used. Aluminum is cheaper, more abundant, relatively resistant to full oxidation and corrosion, when exposed to atmospheric conditions, than either calcium or magnesium. Moreover, the compatibility of Al with silicon microelectronic circuits has made it a material of choice for micro-pixel OLEDs displays driven by thin film transistor or complimentary metal-oxide-semiconductor circuits. However, due to the high work function of Al, OLEDs with Al cathodes are inefficient, and their light output, at a given voltage, is an order of magnitude less than OLEDs with reactive metal cathodes.

A thin insulating layer, such as lithium fluoride (LiF), cesium fluoride (CsF), sodium fluoride (NaF), silicon dioxide, deposited between the Al cathode 30 and the organic layer 40 as a buffer layer has also been used and has lead to some improvements in performance. However, the deposition of a buffer layer requires very careful thickness control. Any thickness variation over the active area of the device leads to uneven electric field distribution, which results in nonuniform brightness, an unacceptable feature in display applications.

Cathodes of Al—Li alloy (a two-metal alloy) have also been tried since they do not require an insulating buffer layer. However, these cathodes are not very reproducible, mainly due to the strict Li content that must be maintained at 0.1% for optimum performance.

Although the devices have shown some progress in the reliability of OLEDs, in terms of operational lifetime, higher operational lifetime are desirable. Furthermore, there is a need for an OLED having enhanced external quantum efficiency and injected electrons densities, and at the same time being reliable, stable, not requiring a buffer layer and having an increased efficiency, reproducibility, and lifetime.

Examples of light-emitting devices are disclosed in U.S. Pat. No. 5,399,502; in Tang et al, "Organic Electroluminescent diodes" Appl. Phys. Lett. 51 (12) 1987; and in Baigent et al, "Conjugated Polymer Light-emitting Diodes on Silicon Substrates" Appl. Phys. Lett. 65 (21) 1994; the entire content of these three references being hereby incorporated by reference.

SUMMARY OF THE INVENTION

Accordingly, an object of the present invention is to provide a cathode having an increased injected electrons densities; and to provide a method for making the same.

Another object of the present invention is to provide an OLED having enhanced external quantum efficiency and injected electrons densities; and to provide a method for making the same.

Yet another object of the present invention is to provide an OLED that is reliable, stable, that does not require a buffer layer; and to provide a method for making the same.

A further object of the present invention is to provide an OLED with an increased efficiency, reproducibility, and lifetime; and to provide a method for making the same.

Another object of the present invention is to provide a display device with OLEDs having increased performance; the display being incorporated, for example, in FPDs for high definition televisions, personal computers, and portable computers; in roll-up displays; or in head-mounted displays, such as virtual reality and cockpit displays.

A further object of the present invention is to provide an organic transistor with a cathode having an increased injected electrons densities.

It is a further object of the present invention to provide an organic solid state laser with a cathode having an increased injected electrons densities.

In a first embodiment, the present invention provides a device including a layer of organic material and a cathode in contact with the organic material layer and including a mixture of a metal and an insulator. The mixture can be either an alloy, a composite, or a combination of both. The metal can be for example Al, Mg, silver (Ag), gold (Au), copper (Cu), nickle (Ni), iron (Fe), chrominum (Cr), indium (In), calcium (Ca), or a combination thereof. The insulator can be an inorganic insulator such as but not limited to alkali, and alkaline compounds, e.g.,: lithium fluoride (LiF), cesium fluoride (CsF), sodium fluoride (NaF), lithium bromide (LiBr), cesium bromide (CsBr), sodium bromide (NaBr), calcium fluoride ($CaF_2$), magnesium fluoride ($MgF_2$), berilium fluoride ($BeF_2$), lithium oxides ($Li_2O$), cesium oxide ($Cs_2O$), rubidium chloride (RbCl), sobium chloride (NaCl), lithium borate ($LiBO_2$), lithium iodide (LiI), cesium iodide (CsI), potasium silicate ($K_2SiO_3$), and combination thereof.

In a second embodiment, the present invention provides an OLED including an emitting layer of organic material; a cathode in contact with the emitting layer and including a mixture of a metal and an insulator; and an anode in contact with the emitting layer. The mixture can be either an alloy, a composite, or a combination of both. The metal can be a high work function metal, or can be Al, Mg, Ni, Fe, Cr, In, Ca, Au, Ag, and combination thereof. The insulator can be an inorganic insulator such as but not limited to alkali, and alkaline compounds, e.g.,: lithium fluoride (LiF), cesium fluoride (CsF), sodium fluoride (NaF), lithium bromide (LiBr), cesium bromide (CsBr), sodium bromide (NaBr), calcium fluoride ($CaF_2$), magnesium fluoride ($MgF_2$), berilium fluoride ($BeF_2$), lithium oxides ($Li_2O$), cesium oxide ($Cs_2O$), rubidium chloride (RbCl), sobium chloride (NaCl), lithium borate ($LiBO_2$), lithium iodide (LiI), cesium iodide (CsI), potasium silicate ($K_2SiO_3$), and combination therof.

In a third embodiment, the OLED includes a metal capping layer in contact with the composite cathode. The metal capping layer can be made of Al, Cr, Ag, Au or combination.

In a fourth embodiment, the OLED includes a substrate in contact with an anode. The substrate can be made of a ceramic such as glass or silicon, plastic, or metal.

In a fifth embodiment, the emitting layer includes a multi-layer having a hole transport layer and an electron transport layer. The electron transport layer can be made of $Alq_3$, and the hole transport layer can be made of TPD. The emitting layer can also be a single or multilayer with organic dye as dopant.

In a sixth embodiment, the present invention provides an organic transistor including a cathode in contact with an organic material layer and including a mixture of a metal and an insulator. The mixture can be either an alloy, a composite, or a combination of both. The metal can be for example Al, Mg, Ni, Fe, Cr, In, Ca, Au, Ag, and combination thereof. The insulator can be an inorganic insulator such as but not limited to alkali, and alkaline compounds, e.g.,: lithium fluoride (LiF), cesium fluoride (CsF), sodium fluoride (NaF), lithium bromide (LiBr), cesium bromide (CsBr), sodium bromide (NaBr), calcium fluoride ($CaF_2$), magnesium fluoride ($MgF_2$), berilium fluoride ($BeF_2$), lithium oxides ($Li_2O$), cesium oxide ($Cs_2O$), rubidium chloride (RbCl), sobium chloride (NaCl), lithium borate ($LiBO_2$), lithium iodide (LiI), cesium iodide (CsI), potasium silicate ($K_2SiO_3$), and combination thereof.

In a seventh embodiment, the present invention provides an organic solid state laser including a cathode in contact with an organic material layer and including a mixture of a metal and an insulator. The mixture can be either an alloy, a composite, or a combination of both. The metal can be for example Al, Mg, Ni, Fe, Cr, In, Ca, Au, Ag, and combination thereof. The insulator can be an inorganic insulator such as but not limited to alkali, and alkaline compounds, e.g.,: lithium fluoride (LiF), cesium fluoride (CsF), sodium fluoride (NaF), lithium bromide (LiBr), cesium bromide (CsBr), sodium bromide (NaBr), calcium fluoride ($CaF_2$), magnesium fluoride ($MgF_2$), berilium fluoride ($BeF_2$), lithium oxides ($Li_2O$), cesium oxide ($Cs_2O$), rubidium chloride (RbCl), sobium chloride (NaCl), lithium borate ($LiBO_2$), lithium iodide (LiI), cesium iodide (CsI), potasium silicate ($K_2SiO_3$), and combination thereof.

The above embodiments also apply to a single or multilayer: polymer OLED as well as molecular-polymer blend OLED, and organic-inorganic hybrid OLED.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 2(A) shows the chemical structure of TPD used in a hole transport layer; FIG. 2(B) shows the chemical structure of $Alq_3$ used in an electron transport layer.

FIG. 6(A) shows the current density versus bias voltage for the above devices. FIG. 6(B) shows the forward light output versus bias voltage for the above devices.

FIG. 8(A) shows the forward light output versus bias voltage for the above devices. FIG. 8(B) shows the luminous efficiency versus bias voltage for the above devices.

DESCRIPTION OF THE PREFERRED EMBODIMENTS

Figure 3:
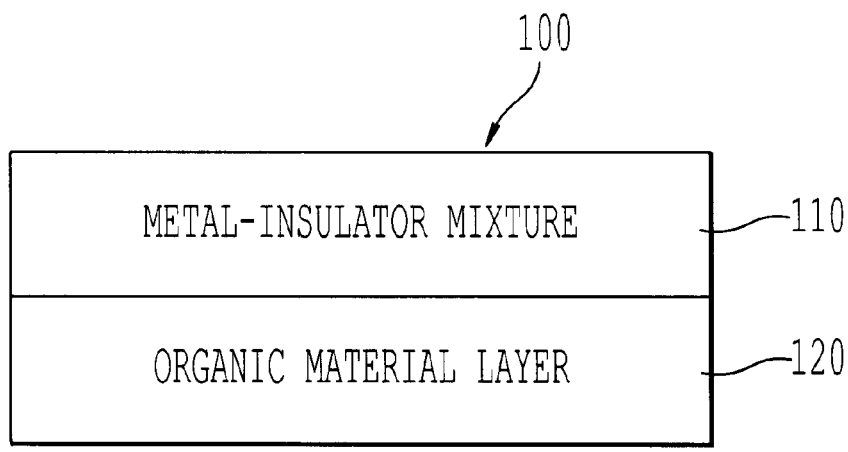
FIG. 3 shows a block diagram of a cathode according to a first embodiment of the present invention.

Referring now to the drawings, wherein like reference numerals designate identical or corresponding parts throughout the several views, a first embodiment of the present invention in the form of OLED as shown in the block diagram of FIG. 3 is described.

As a first embodiment, the device 100 shown in FIG. 3 includes an organic material layer 120 of organic material; and a cathode 110 in contact with the organic material layer 120 and including a mixture of a metal and an insulator. The mixture in cathode 110 can be either an alloy, a composite, or a combination of both. Here, an alloy is understood to be a mixture where individual atoms and/or molecules of each component form chemical bonds among each other. On the other hand, a composite is a mixture where each component is present in one or more phases and the phases are mixed within a composite layer. The relative concentration of the components is one of the factors that determines whether the mixture forms an alloy or a composite. The present invention works for a wide range of relative concentration, for example, 1–30% insulator and preferably between 2–7%. Cathode 110 thus works with both a metal-insulator alloy cathode and a metal-insulator composite cathode.

The metal in the cathode mixture can be for example Al, Mg, Ni, Fe, Cr, In, Ca, Au, Ag, and combination thereof. The insulator can be an inorganic insulator such as but not limited to alkali, and alkaline compounds, e.g.,: lithium fluoride (LiF), cesium fluoride (CsF), sodium fluoride (NaF), lithium bromide (LiBr), cesium bromide (CsBr), sodium bromide (NaBr), calcium fluoride ($CaF_2$), magnesium fluoride ($MgF_2$), berilium fluoride ($BeF_2$), lithium oxides ($Li_2O$), cesium oxide ($Cs_2O$), rubidium chloride (RbCl), sobium chloride (NaCl), lithium borate ($LiBO_2$), lithium iodide (LiI), cesium iodide (CsI), potassium silicate ($K_2SiO_3$), and combination thereof. The thickness of the cathode can be between 10 nanometer–10 micrometer, preferably between 50–300 nanometer.

Device 100 can be incorporated into an OLED, an organic transistor, an organic solid state laser, or any device requiring carrier injection into an organic layer.

Figure 4:
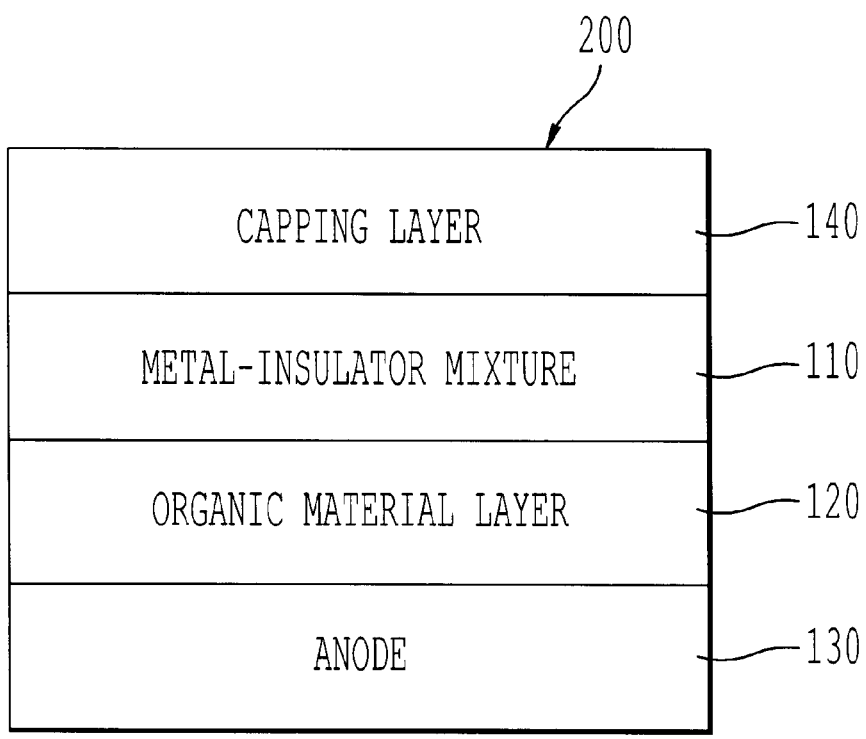
FIG. 4 shows a block diagram of an OLED according to another embodiment of the present invention.

FIG. 4 shows another embodiment of the present invention, and more specifically a OLED 200 in which above described layers 110 and 120 are incorporated. OLED also includes an anode 130 made of a conductive material, for example a metal or a doped semiconductor. As an example, anode 130 can be made of indium tin oxide (ITO), which is transparent to visible light. The OLED 200 can also include an optional capping layer 140 made of a conducting material, for example Al, Au, Ag or combination thereof. The capping layer helps in further environmental protection. The thickness of the capping layer is not critical and may be between about 100 nanometer–2 micrometers. In OLED 200, organic layer 120 is an emitting layer and thus can be made of any known electroluminescent organic (ELO) material.

Figure 1:
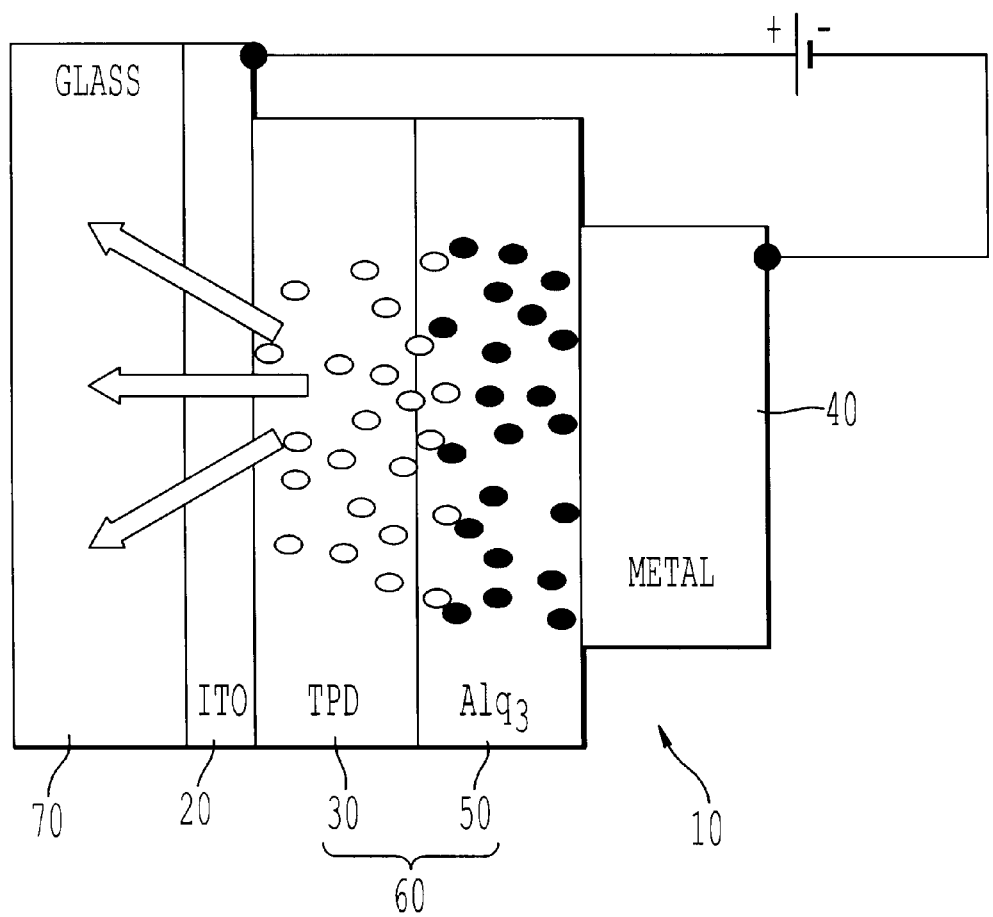
FIG. 1 shows a block diagram of a conventional OLED with a bilayer emitting layer and a metal cathode.
Figure 2A:
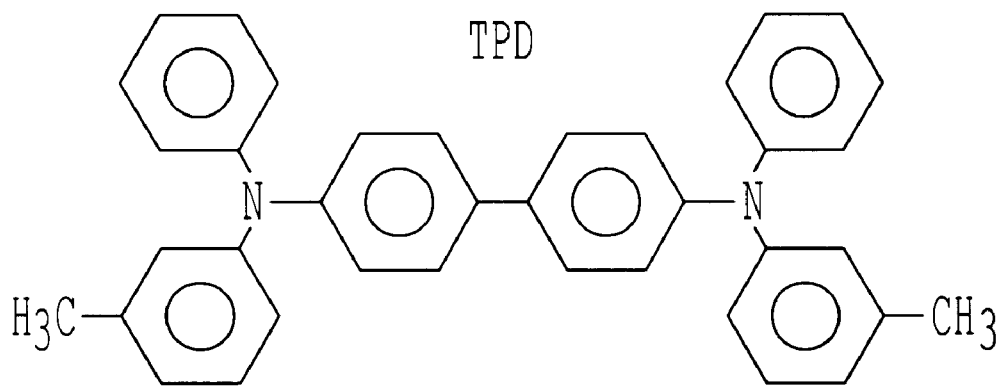
FIGS. 2(A)–(B) show the chemical structure of two organic materials conventionally used in an organic bilayer emitting layer.
Figure 2B:
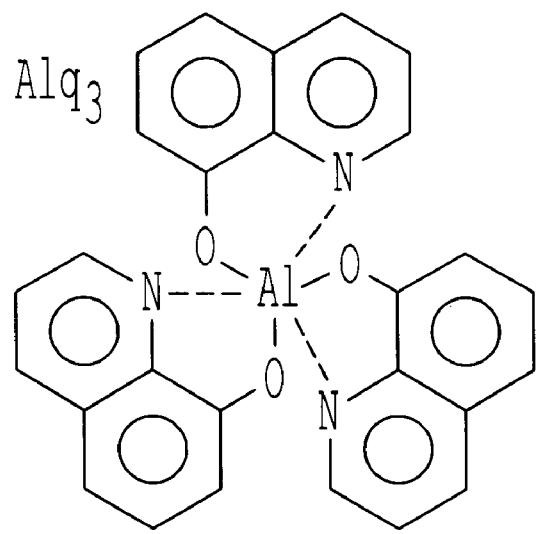
Figure 5:
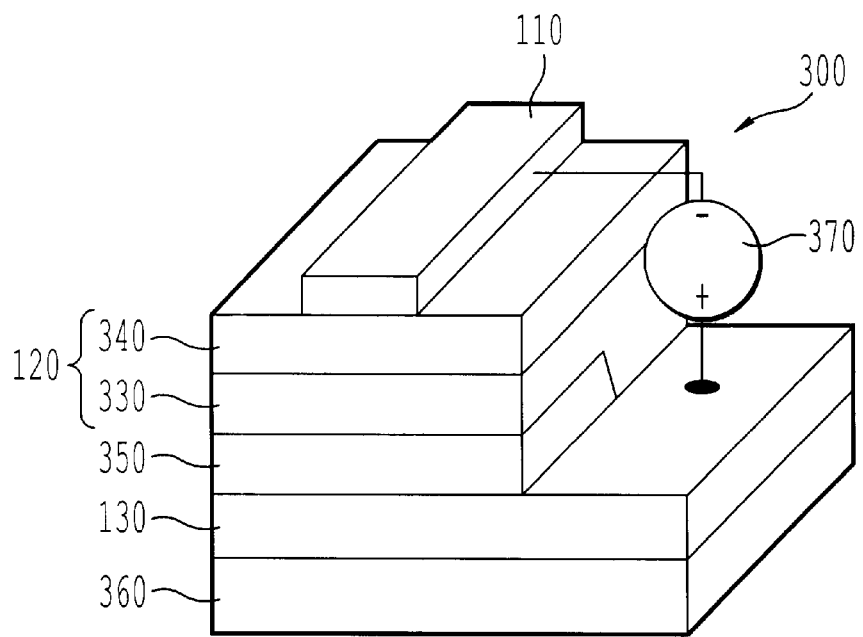
FIG. 5 shows a block diagram of an OLED according to another embodiment of the present invention.

FIG. 5 shows another embodiment of the present invention, and more specifically a OLED 300 including above described cathode 110 and an organic emitting layer 120 that is a bilayer with an organic hole transport layer (HTL) 330 and an organic electron transport layer (ETL) 340. The HTP 330 can be made of TPD for example, the structure of which is shown in FIG. 2(A), and can have a thickness between about 0–300 nanometer. The ETL can be made of 8-tris-hydroxyquinoline ($Alq_3$) for example, the structure of which is shown in FIG. 2(B), and can have a thickness between about 0–300 nanometer. Alternatively, HTL 330 and ETL 340 can include a mixture of organic-inorganic materials. Light emission can take place in either of the HTL, ETL, or both. Alternatively, an additional organic (or organic-inorganic mixture) can be inserted between the HTL and ETL layers for light emission purposes while the HTL and ETL function for charge conduction.

An optional SiO strip 350 can also be added in device 300 in order to avoid electrically short-circuiting the device during testing. The SiO strip does not cover the whole anode 130.

As shown in FIG. 5, the anode 130 can be supported by a substrate 360, which can be made of a ceramic such as glass or silicon, plastic, or metal. Application of the voltage across the cathode and the anode can be performed with a conventional voltage source 370, as will be recognized by persons of ordinary skill in the art.

The OLEDs of the present invention can be fabricated based on thin film (or films) of thermally deposited organic molecules, conjugated polymers, or molecularly doped polymers. A simple fabrication process of bilayer (two organic layers) OLEDs using small molecules normally proceeds by cleaning the substrate 360 using an ultrasonic bath of acetone, followed by isopropyl alcohol, and then methanol. The substrate is then loaded in a vacuum system, equipped with thermally resistive heating elements, where a hole transport layer of N-N'-diphenyl-N-N'bis(3-methylphenyl)[1-1'-biphenyl]-4-4'-diamine (TPD) is deposited on top of an ITO layer, followed by a layer of an electron transport and light-emitting material, such as, 8-tris-hydroxyquinoline aluminum ($Alq_3$). The fabrication of the bilayer OLED can be carried out in a small bell-jar deposition system (diameter=25 cm, height=25 cm, and substrate-to-source distance=17 cm), encapsulated in a nitrogen gas glove box. The operating vacuum can be about $10^{-5}$–$10^6$ Torr.

With respect to forming the cathode mixture layer 110, it can be made by vacuum co-deposition of two, or more materials, including the metal and the insulator. The metals can be for example Al, Mg, Ni, Fe, Cr, In, Ca, Au, Ag, and combination thereof. The insulator can be an inorganic insulator such as but not limited to alkali, and alkaline compounds, e.g.,: lithium fluoride (LiF), cesium fluoride (CsF), sodium fluoride (NaF), lithium bromide (LiBr), cesium bromide (CsBr), sodium bromide (NaBr), calcium fluoride ($CaF_2$), magnesium fluoride ($MgF_2$), berilium fluoride ($BeF_2$), lithium oxides ($Li_2O$), cesium oxide ($Cs_2O$), rubidium chloride (RbCl), sobium chloride (NaCl), lithium borate ($LiBO_2$), lithium iodide (LiI), cesium iodide (CsI), potassium silicate ($K_2SiO_3$), and combination thereof. The co-depsotion can be done, for example, by using thermal, sputtering, or electron beam techniques. The materials can be put in deposition material holders such as flat boats, crucibles or wires. The distance between the substrates and the material sources can be adjusted to avoid overheating of the organics. The deposition rate of the metals can be for example between 0.2–30 angstroms per second and that of the insulating material can be for example between 0.002 to 4 angstroms per second depending on the metal deposition rate. As is well known in the art, the deposition rate can be varied by varying the temperature. As is also known in the art, the deposition rate determines the relative concentration of the elements of the mixture, which in tern determines whether an alloy or composite is formed. Once the mixed cathode is deposited it can be followed by the deposition of the capping layer.

Figure 6A:
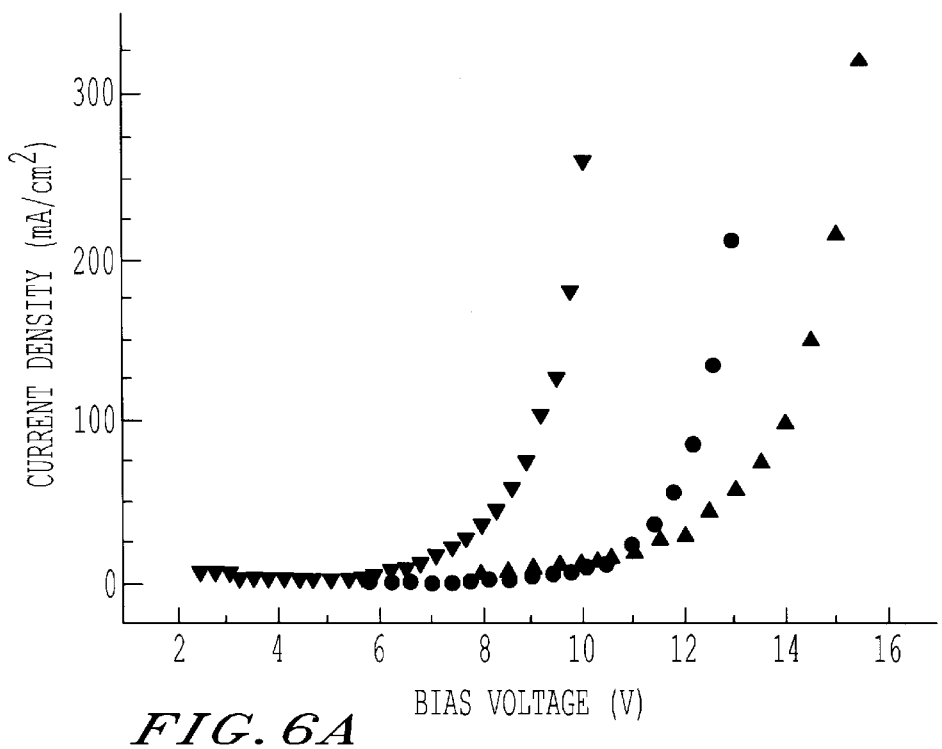
FIGS. 6(A)–(B) show comparative data between a device according to the present invention with a Al:LiF cathode (▼), and conventional devices with an Al cathode (▲), and a Mg cathode (●).
Figure 6B:
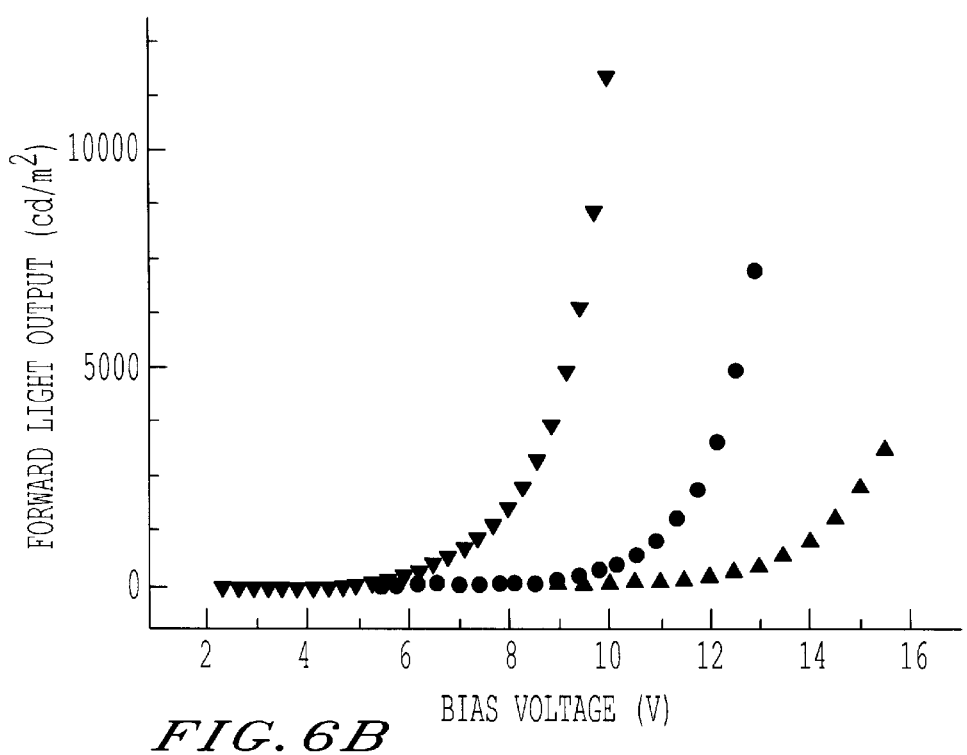
Figure 7:
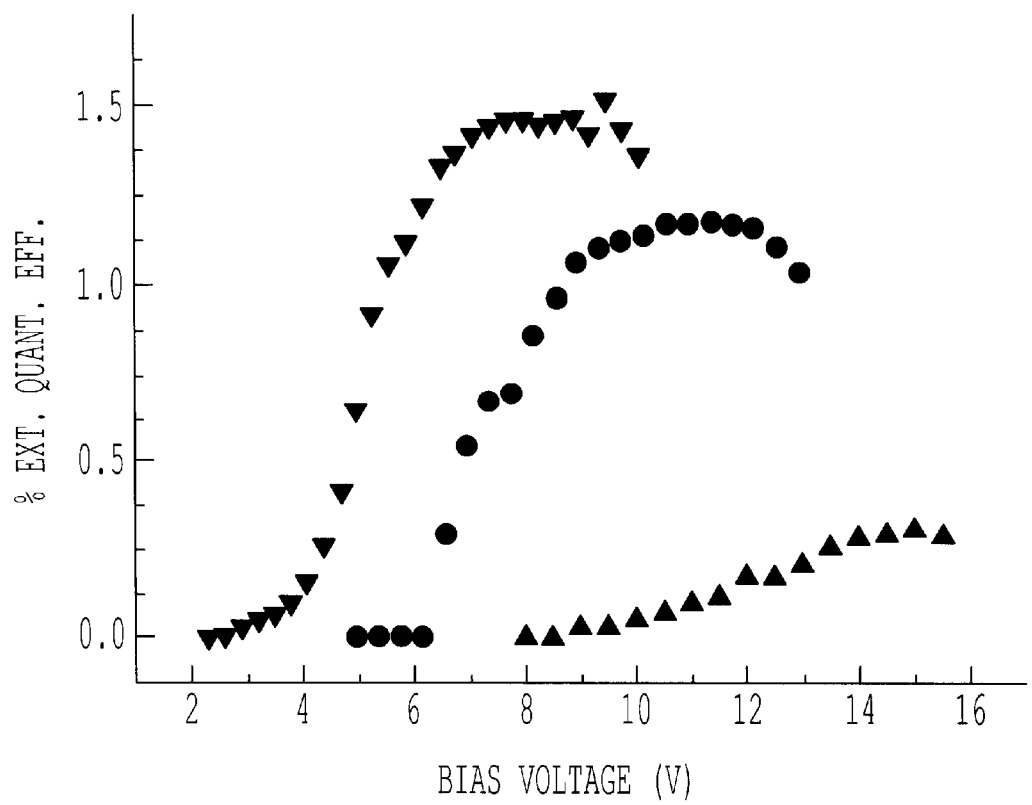
FIG. 7 shows comparative data between a device according to the present invention with a Al:LiF cathode (▼), and conventional devices with an Al cathode (▲), and a Mg cathode (●). The data represent the percent external quantum efficiency (photons/electrons) versus bias voltage.

The electroluminescent properties of OLEDs made with Al:LiF, Al:CsF; Al and Mg are shown in FIGS. 6–8. As indicated in these figures, OLEDs with cathodes according to the present invention using a mixture of Al:LiF or Al:CsF show superior performance compared to conventional devices based only on Al and Mg. FIG. 6(A) shows that the cathodes according to the present invention (Al:LiF, represented by ▼) lead to an improved current density compared to the Al (▲) and Mg (●) cathodes of the conventional devices. FIG. 6(B) shows that OLEDs with the Al-LiF (▼) mixture cathode of the present invention have an improved forward light output of about 11600 cd/m$^2$, and FIG. 7 shows an improved maximum external quantum efficiency of 1.45% for these devices. On the other hand, OLEDs with an Al cathode (▲) have a peak forward light output of only 3000 cd/m$^2$, and only 0.3% in external quantum efficiency, as seen in FIGS. 6(B) and 7 respectively. For an Mg cathode (●), the maximum light output is 7100 cd/m$^2$ V and the external quantum efficiency is 1.1%, as seen in FIGS. 6(B) and 7 respectively. Furthermore, light emission for the devices of the present invention starts at a drive voltage as low as 3 V, while emission starts at about 9 V for the Al devices and about 6 V for the Mg devices.

Figure 8A:
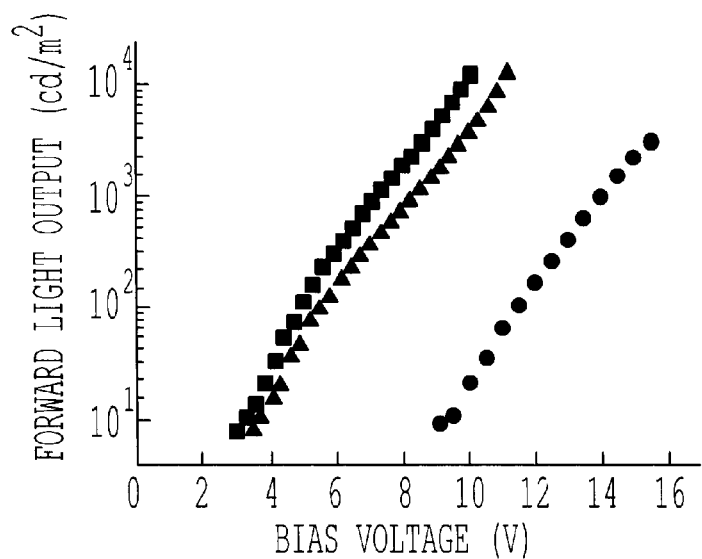
FIGS. 8(A)–(B) show comparative data between devices according to the present invention with a Al:LiF cathode (■), a Al:CsF cathode (▲) and a conventional device with an Al cathode (●).
Figure 8B:
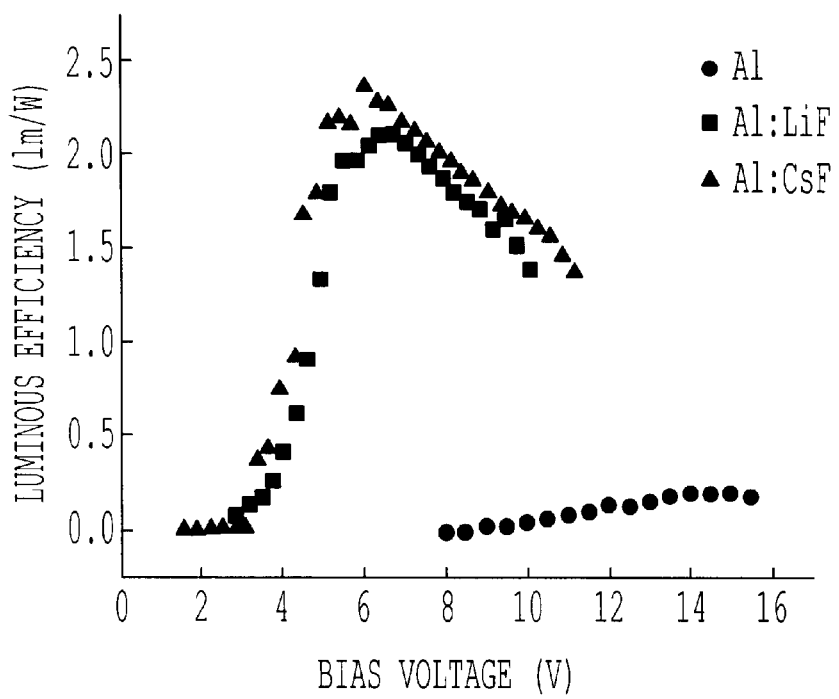

The devices according to the present invention thus have a lower operating voltage and power consumption, while at the same time have an improved brightness and efficiency, compared to the conventional devices. In all cases, the green light emission, characteristic of Alq$_3$, is uniform over the whole active area of the device. The inventors of the present invention have also found, that the performance of an OLED with a cathode of AL:CsF was several times better than devices based on Al, Mg, or Na cathodes. This is illustrated in FIG. 8(A) which shows the forward light output versus bias voltage for cathodes of Al:CsF (▲), Al:LiF (■) and Al (●); and in FIG. 8(B) which shows the luminous efficiency versus bias voltage for the same devices.

The increased electron injection in devices according to the present invention, which is evidenced by the data shown in FIGS. 6–8, is not believed to be due the same physical phenomenon as for the conventional devices using an LiF buffer layer. Also, inserting a buffer layer between the cathode and the organic film prevents a direct contact between Al and Alq$_3$, thus minimizing the formation of the gap states. Gap states result from chemical bonding between Al and Alq$_3$ at the Al/Alq$_3$ interface. These states act as excitor quenching sites, thus reducing the light output. However, in devices according to the present invention, a noticeable enhancement in device performance can still be seen even though the direct contact between Al and the Alq$_3$ has not been eliminated.

The present invention provides several other advantages over prior art devices, as next discussed.

The cathode of the present invention eliminates the need for a thin buffer layer, thus simplifying device geometry. Furthermore, the content of the insulator mixed in the metal is usually higher than 1%, making the fabrication of the cathode of the present invention easier than the Al:Li alloy cathode of the prior art, which require a strict control of the Li content at 0.1% for optimum efficiency.

The cathode of the present invention enhances the adhesion to the organic layer underneath it leading to longer operational lifetime. Using environmentally stable metal contacts, the present invention allows for the fabrication of organic light-emitting devices with improved lifetimes and reliability.

The present invention is expected to be particularly useful in computer displays, wherein a typical computer display brightness is about 100–300 cd/m$^2$. At 300 cd/m$^2$, OLEDs with Al—LiF cathode according to the present invention are 13 times better in luminous efficiency (lm/W) than similar devices with an Al-only cathode. Various other display applications are possible, for example high definition televisions, portable computers, roll-up displays, head-mounted displays, such as virtual reality and cockpit displays. Furthermore, the OLEDs according to the present invention can be incorporated in the display devices disclosed in U.S. Pat. Nos. 5,424,560; 5,583,349; 5,583,350; and 5,587,589, the entire content of these four patents being hereby incorporated by reference. A display device according to the present invention thus includes a plurality of organic light-emitting devices each formed according to the various embodiments of the present invention and exemplified in FIGS. 3–5. The plurality of OLEDs are arranged in an array configured to produce an image.

Figure 9:
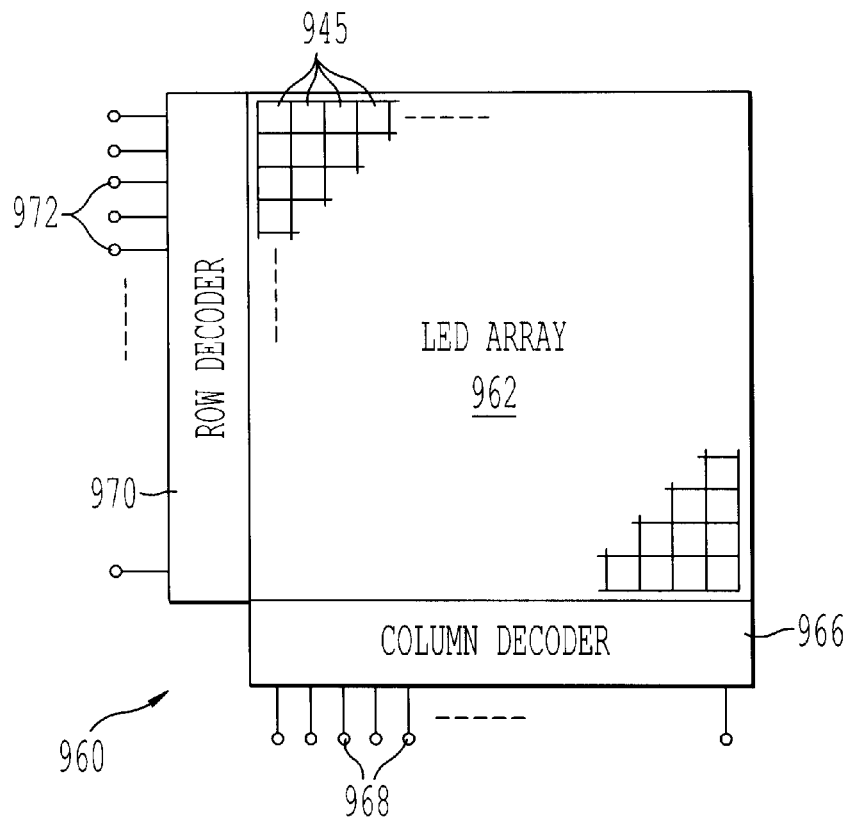
FIG. 9 shows a display device according to one embodiment of the present invention.

For example, FIG. 9 shows a display 960 sharing features with a conventional display, such as the display disclosed in U.S. Pat. No. 5,424,460, but incorporating OLEDs according to the present invention. Display 960 includes a LED array 962, which is a plurality of pixels 945 arranged in rows and columns. The display 960 further includes a column decoder 966 electrically connected to pixels 945 and having a plurality of signal input terminals 968 and a row decoder 970 electrically connected to pixels 945 and having a plurality of signal input terminals 972. Each pixel 945 can include one or more OLEDs as described above, with driver portions connected to be operated by column and row decoders 966 and 970.

Furthermore, the mixture cathodes of the present invention, as exemplified in FIG. 3, can be used in any organic device where charge injection is required. In particular, the improved injection of electric current densities obtained with the present invention can be useful in organic transistors and organic solid state lasers. More specifically, the mixture cathode of the present invention can be incorporated into the organic transistor disclosed in U.S. Pat. Nos. 5,315,129 and 5,970,318, the entire contents of which are hereby incorporated by reference. Furthermore, the mixture cathode of the present invention can be incorporated into the organic laser disclosed in U.S. Pat. No. 5,881,089 the entire content of which is hereby incorporated by reference.

Figure 10:
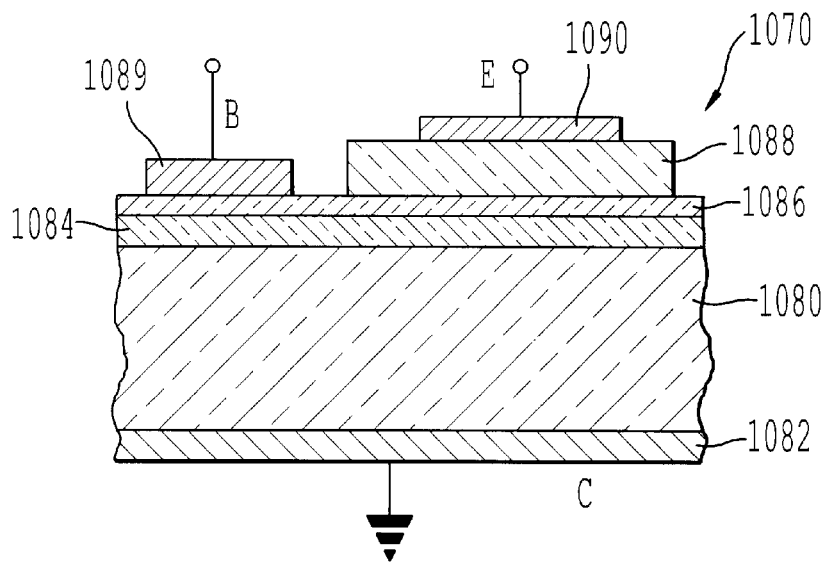
FIG. 10 shows a transistor according to one embodiment of the present invention.

For example, FIG. 10 shows a bipolar organic transistor 1070 sharing features with a conventional transistor, such as the transistor disclosed in U.S. Pat. No. 5,315,129, but incorporating the cathode according to the present invention. The organic transistor 1070 includes a contact 1082 for a substrate 1080. A collector 1084 is formed on the substrate 1080. A base 1086 is formed on the collector 1084. The base 1086 has a contact 1089. An emitter 1088 is formed with an organic material on the base 1086. A contact 1090 is formed in accordance with the present invention for the emitter 1088, i.e., the contact 1090 is formed with a mixture of a metal and an insulator. Other organic transistors are within the scope of the present invention.

Figure 11:
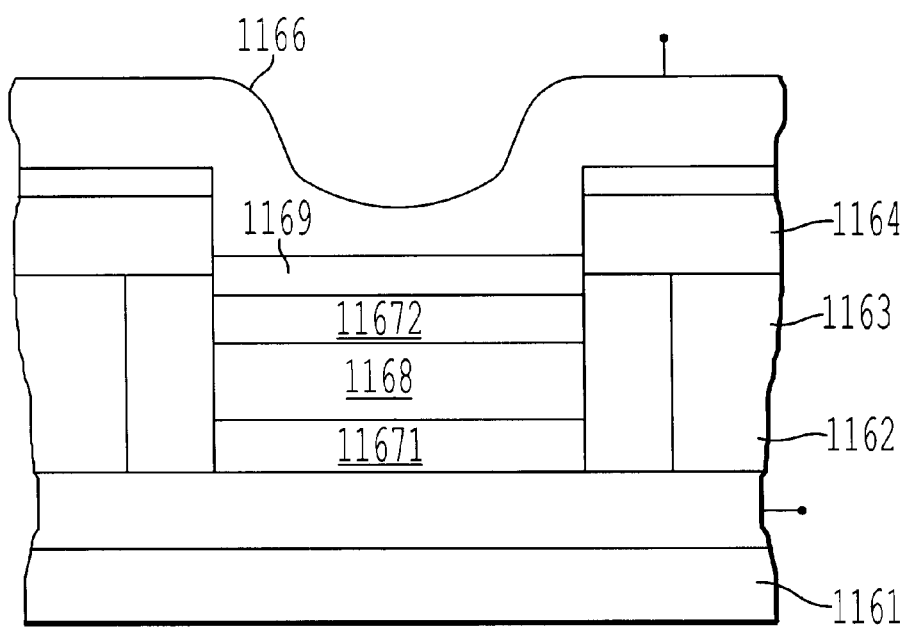
FIG. 11 shows a laser according to one embodiment of the present invention.

An example of an organic solid state laser is shown in FIG. 11. The organic laser 1160 shares features with a conventional organic laser, such as the laser disclosed in U.S. Pat. No. 5,881,089, but incorporates a cathode according to the present invention. The organic laser 1160 includes a glass substrate 1161 and an indium tin oxide (ITO) layer 1162 formed thereon. A hole transport layer (HTL) 11671 is formed on the ITO layer 1162. An absorption/emission layer 1168 is formed on the HTL layer 11671. Another HTL layer 11672 is formed on the absorption/emission layer 1168. An organic electron transport layer (ETL) 1169 is formed on the HTL layer 11672. A cathode 1166 is formed according to the present invention on the ETL layer 1169. In other words, the cathode 1166 is formed with a mixture of a metal and an insulator. The stack of layers between the ITO layer 1162 and the cathode 1166 can be enclosed in a reflecting cavity 1163.

Obviously, numerous modifications and variations of the present invention are possible in light of the above teachings. It is therefore to be understood that within the scope of the appended claims, the invention may be practiced otherwise than as specifically described herein.

What is claimed as new and desired to be Secured by Letters Patent of the United States is:

1. An organic device, comprising:
   an organic layer of organic material; and
   a cathode in contact with said organic layer and comprising a mixture of a metal and an insulator.
2. An organic device according to claim 1, wherein said mixture comprises an alloy of said metal and said insulator.
3. An organic device according to claim 1, wherein said mixture comprises a composite of said metal and said insulator.
4. An organic device according to claim 1, wherein said mixture comprises:
   an alloy of said metal and said insulator, and
   a composite of said metal and said insulator.
5. An organic device according to claim 1, wherein:
   said insulator is an alkali.
6. An organic device according to claim 1, wherein:
   said insulator is an alkaline compound.
7. An organic device according to claim 1, wherein:
   said mixture comprises Al:LiF.
8. An organic device according to claim 1, wherein:
   said mixture comprises Al:CsF.
9. An organic light-emitting device, comprising:
   an organic emitting layer of organic material; and
   a cathode in contact with said organic emitting layer and comprising a mixture of a metal and an insulator.
10. An organic light-emitting device according to claim 9, wherein said mixture comprises an alloy of said metal and said insulator.
11. An organic light-emitting device according to claim 9, wherein said mixture comprises a composite of said metal and said insulator.
12. An organic light-emitting device according to claim 9, wherein said mixture comprises:
    an alloy of said metal and said insulator, and
    a composite of said metal and said insulator.
13. An organic light-emitting device according to claim 9, wherein:
    said insulator is an alkali.
14. An organic light-emitting device according to claim 9, wherein:
    said insulator is an alkaline compound.
15. An organic light-emitting device according to claim 9, wherein:
    said mixture comprises Al:LiF.
16. An organic light-emitting device according to claim 9, wherein:
    said mixture comprises Al:CsF.
17. An organic light-emitting device according to claim 9, further comprising:
    a metal capping layer in contact with said cathode.
18. An organic light-emitting device according to claim 17, wherein said metal capping layer comprises Al.
19. An organic light-emitting device according to claim 9, further comprising:
    an anode in contact with said organic emitting layer.
20. An organic light-emitting device according to claim 19, wherein said anode comprises an indium tin oxide.
21. An organic light-emitting device according to claim 19, further comprising:
    a substrate in contact with said anode.
22. An organic light-emitting device according to claim 9, wherein:
    said organic emitting layer comprises a bilayer having a hole transport layer and an electron transport layer.
23. An organic light-emitting device according to claim 22, wherein:
    said electron transport layer comprises $Alq_3$, and
    said hole transport layer comprises TPD.
24. A display device, comprising:
    a plurality of organic light-emitting devices, each comprising,
    an organic layer of organic material, and
    a cathode in contact with said organic layer and comprising a mixture of a metal and an insulator.
25. A display device according to claim 24, wherein said insulator is an alkali.
26. A display device according to claim 24, wherein said insulator is an alkaline compound.
27. A display device according to claim 24, wherein said mixture comprises Al:LiF.
28. A display device according to claim 24, wherein said mixture comprises Al:CsF.
29. An organic transistor, comprising:
    an organic emitter layer of organic material;
    a cathode in contact with said organic emitter layer comprising a mixture of metal and an insulator;
    a base layer in contact with said organic emitter layer; and
    a collector layer in contact with said base layer.
30. An organic transistor according to claim 29, wherein said insulator is an alkali.
31. An organic transistor according to claim 29, wherein said insulator is an alkaline compound.
32. An organic transistor according to claim 29, wherein said mixture comprises Al:LiF.
33. An organic transistor according to claim 29, wherein said mixture comprises Al:CsF.
34. An organic solid state laser, comprising:
    an organic layer of organic material;
    a cathode in contact with said organic layer and comprising a mixture of a metal and an insulator;
    a hole transport layer in contact with said organic layer;

a cathode in contact with said hole transport layer; and a cavity around said organic layer and said hole transport layer.

35. An organic solid state laser according to claim 34, wherein said insulator is an alkali.

36. An organic solid state laser according to claim 34, wherein said insulator is an alkaline compound.

37. An organic solid state laser according to claim 34, wherein said mixture comprises Al—LiF.

38. An organic solid state laser according to claim 34, wherein said mixture comprises Al:CsF.

39. A method of making an organic device, comprising the steps of:

forming an organic layer; and depositing on said organic layer a mixture of a metal and an insulator.

40. A method according to claim 39, wherein depositing said mixture comprises depositing an Al—LiF mixture.

41. A method according to claim 39, wherein depositing said mixture comprises depositing an Al—CsF mixture.

42. A method according to claim 39, further comprising:

forming an anode in contact with said organic layer.

43. A method according to claim 42, further comprising:

forming a capping layer in contact with said mixture.

44. A method according to claim 39, wherein depositing said mixture comprises depositing an alkali.

45. A method according to claim 39, wherein depositing said mixture comprises depositing an alkaline compound.

* * * * *